United States Patent
Narushima et al.

(10) Patent No.: US 10,872,814 B2
(45) Date of Patent: Dec. 22, 2020

(54) FILM FORMING METHOD AND FILM FORMING APPARATUS

(71) Applicant: TOKYO ELECTRON LIMITED, Tokyo (JP)

(72) Inventors: Kensaku Narushima, Yamanashi (JP); Takanobu Hotta, Yamanashi (JP); Atsushi Matsumoto, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/574,757

(22) Filed: Sep. 18, 2019

(65) Prior Publication Data

US 2020/0098624 A1  Mar. 26, 2020

(30) Foreign Application Priority Data

Sep. 21, 2018  (JP) ................. 2018-177532

(51) Int. Cl.
*H01L 21/768* (2006.01)
*H01L 21/67* (2006.01)
*H01L 21/285* (2006.01)

(52) U.S. Cl.
CPC .. *H01L 21/76843* (2013.01); *H01L 21/28568* (2013.01); *H01L 21/67069* (2013.01); *H01L 21/76879* (2013.01)

(58) Field of Classification Search
CPC ......... H01L 21/76843; H01L 21/67069; H01L 21/28568; H01L 21/76879; H01L 21/68742; H01L 21/68764

See application file for complete search history.

(56) References Cited

U.S. PATENT DOCUMENTS

| | | | | |
|---|---|---|---|---|
| 2015/0279736 A1* | 10/2015 | Hotta | ................. | H01L 21/76879 438/660 |
| 2016/0040287 A1* | 2/2016 | Akasaka | ........... | C23C 16/45534 427/123 |
| 2016/0104624 A1* | 4/2016 | Fu | ..................... | C23C 16/45563 438/674 |
| 2016/0284553 A1* | 9/2016 | Suzuki | ................... | C23C 16/46 |

(Continued)

FOREIGN PATENT DOCUMENTS

| | | |
|---|---|---|
| KR | 3 10-20160115781 A | 10/2016 |
| KR | 10-2017-0017963 A | 2/2017 |
| WO | 2015080058 A1 | 6/2015 |

*Primary Examiner* — John P. Dulka
(74) *Attorney, Agent, or Firm* — Nath, Goldberg & Meyer; Jerald L. Meyer

(57) ABSTRACT

There is provided a film forming method including: an etching step of etching a portion of a base film to reduce a film thickness of the base film by intermittently supplying a tungsten chloride gas into a processing container while performing a purging step in the course of the intermittent supply of the tungsten chloride gas, wherein the processing container accommodates a substrate, and the base film is formed on a surface of the substrate; and a film forming step of forming a tungsten film on the base film by alternately supplying the tungsten chloride gas and a reducing gas for reducing the tungsten chloride gas into the processing container while performing the purging step in the course of the alternate supply of the tungsten chloride gas and the reducing gas, wherein the film forming step occurs after the etching step.

8 Claims, 5 Drawing Sheets

(56) References Cited

U.S. PATENT DOCUMENTS

| | | | |
|---|---|---|---|
| 2016/0351402 A1* | 12/2016 | Suzuki | C23C 16/0281 |
| 2016/0379879 A1* | 12/2016 | Hotta | H01L 21/28562 438/656 |
| 2017/0117155 A1* | 4/2017 | Bamnolker | C23C 16/45523 |
| 2017/0283942 A1* | 10/2017 | Suzuki | H01L 21/76877 |
| 2018/0251898 A1* | 9/2018 | Yamaguchi | C23C 16/45544 |
| 2019/0078207 A1* | 3/2019 | Yagi | C23C 16/14 |
| 2019/0161862 A1* | 5/2019 | Yamaguchi | C23C 16/45553 |
| 2019/0164768 A1* | 5/2019 | Narushima | H01L 21/28562 |
| 2020/0095683 A1* | 3/2020 | Sameshima | C23C 16/4412 |
| 2020/0258747 A1* | 8/2020 | Narushima | H01L 21/32133 |

\* cited by examiner

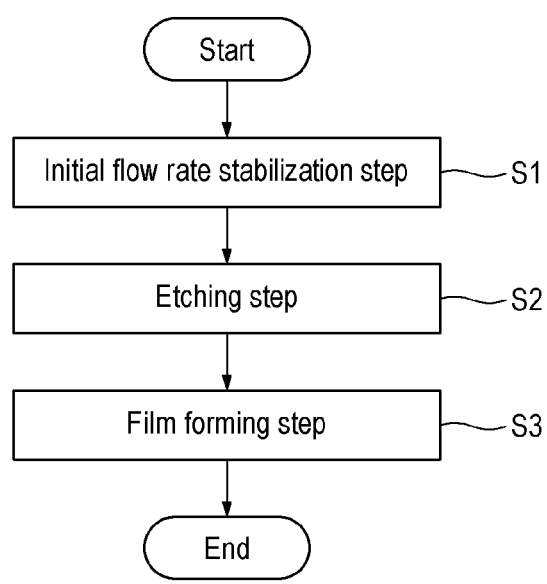

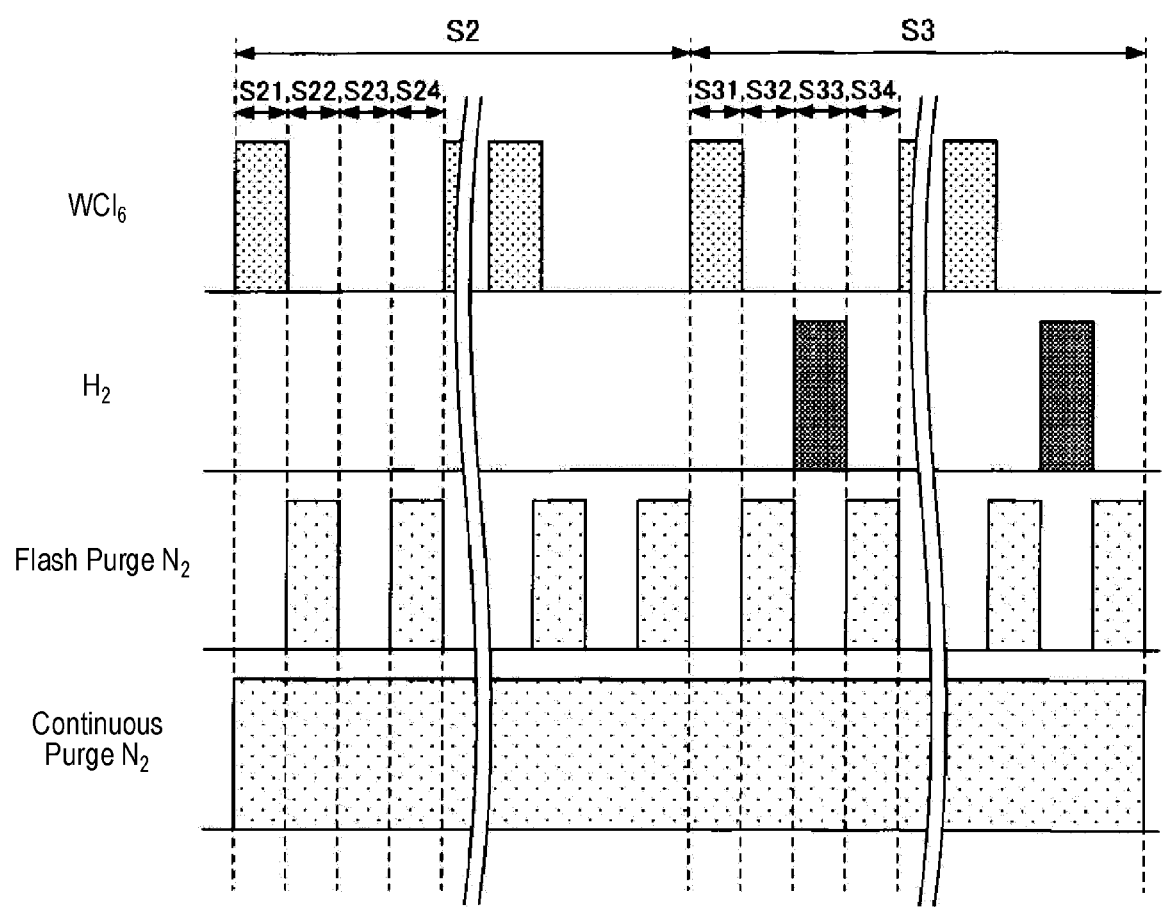

FILM FORMING METHOD AND FILM FORMING APPARATUS

CROSS-REFERENCE TO RELATED APPLICATION

This application is based upon and claims the benefit of priority from Japanese Patent Application No. 2018-177532, filed on Sep. 21, 2018, the entire contents of which are incorporated herein by reference.

TECHNICAL FIELD

The present disclosure relates to a film forming method and a film forming apparatus.

BACKGROUND

There is known a technique in which a base film such as a TiN film is formed in a recess such as a trench or hole, and subsequently, a tungsten film is formed on the base film to fill the recess with the tungsten film. As a method of forming a tungsten film, there is known a method of supplying a tungsten chloride gas and a reducing gas into a processing container that accommodates a substrate, and causing the tungsten chloride gas and the reducing gas to react with each other on the substrate (see, for example, Patent Document 1).

PRIOR ART DOCUMENT

Patent Documents

Patent Document 1: International Publication No. WO 2015/080058

SUMMARY

According to an embodiment of the present disclosure, there is provided a film forming method including: an etching step of etching a portion of a base film to reduce a film thickness of the base film by intermittently supplying a tungsten chloride gas into a processing container while performing a purging step in the course of the intermittent supply of the tungsten chloride gas, wherein the processing container accommodates a substrate, and the base film is formed on a surface of the substrate; and a film forming step of forming a tungsten film on the base film by alternately supplying the tungsten chloride gas and a reducing gas for reducing the tungsten chloride gas into the processing container while performing the purging step in the course of the alternate supply of the tungsten chloride gas and the reducing gas, wherein the film forming step occurs after the etching step.

BRIEF DESCRIPTION OF DRAWINGS

The accompanying drawings, which are incorporated in and constitute a portion of the specification, illustrate embodiments of the present disclosure, and together with the general description given above and the detailed description of the embodiments given below, serve to explain the principles of the present disclosure.

FIG. 2 is a flowchart illustrating an example of a film forming method.

FIG. 3 is a view illustrating an example of a gas supply sequence in an etching step and a film forming step.

DETAILED DESCRIPTION

Figure 1:
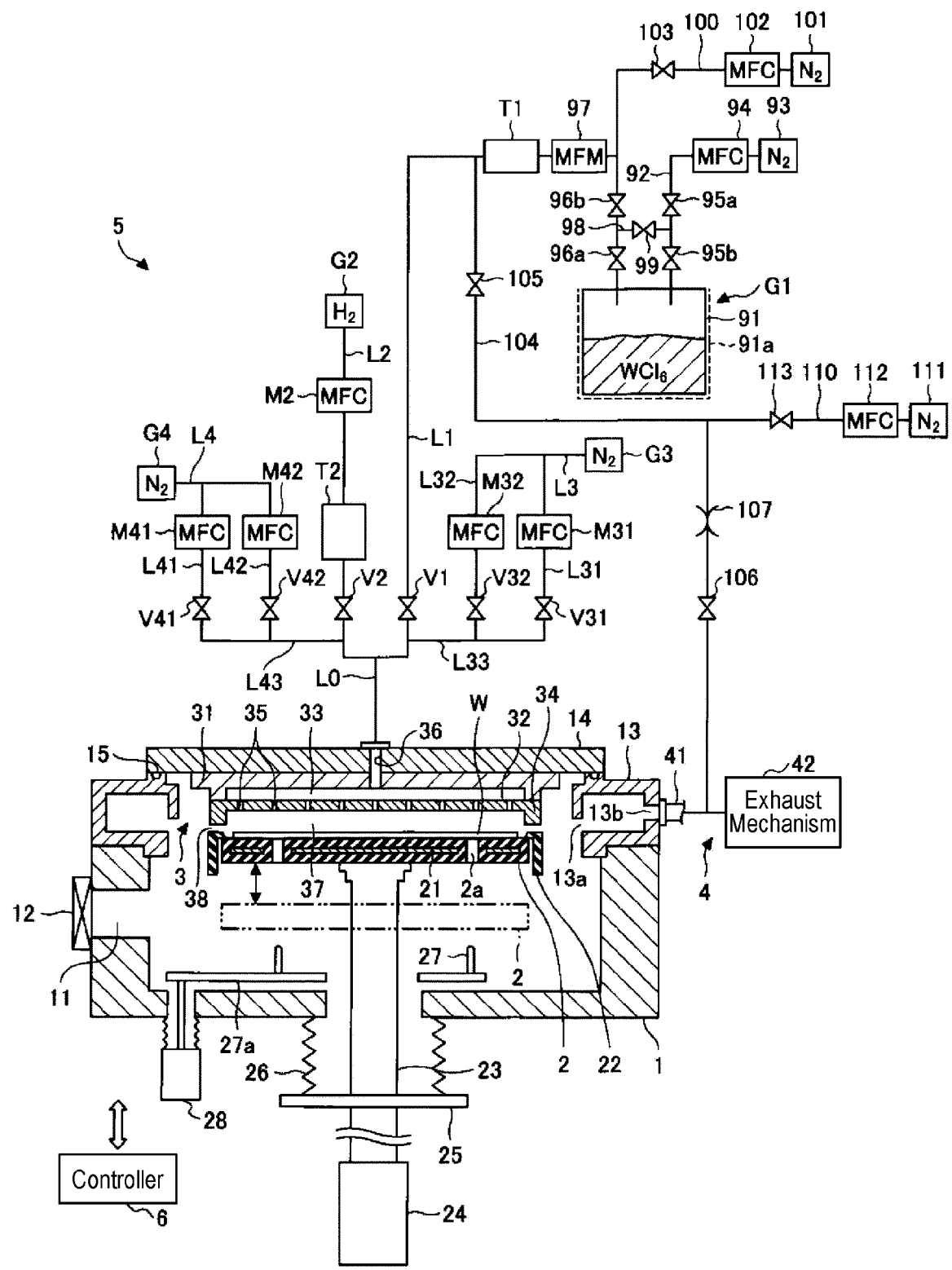
FIG. 1 is a schematic view illustrating an exemplary configuration of a film forming apparatus.

Hereinafter, non-limitative exemplary embodiments of the present disclosure will now be described with reference to the accompanying drawings. In all the accompanying drawings, the same or corresponding members or components will be denoted by the same or corresponding reference numerals, and redundant explanations thereof will be omitted.

(Film Forming Apparatus)

A film forming method according to an embodiment will be described. FIG. 1 is a schematic view illustrating an exemplary configuration of a film forming apparatus. The film forming apparatus illustrated in FIG. 1 is an apparatus capable of forming a tungsten film using an atomic layer deposition (ALD) method.

As illustrated in FIG. 1, the film forming apparatus includes a processing container 1, a stage 2, a shower head 3, an exhaust part 4, a gas supply mechanism 5, and a controller 6.

The processing container 1 is made of a metal such as aluminum and has a substantially cylindrical shape. A loading/unloading port 11 through which a wafer W is transferred is formed in a sidewall of the processing container 1. The loading/unloading port 11 is opened or closed by a gate valve 12. An annular exhaust duct 13 having a rectangular cross section is provided on a main body of the processing container 1. The exhaust duct 13 has a slit 13a formed along an inner peripheral surface thereof. An exhaust port 13b is formed in an outer wall of the exhaust duct 13. A ceiling wall 14 is provided on an upper surface of the exhaust duct 13 so as to close an upper opening of the processing container 1. The exhaust duct 13 and the ceiling wall 14 is hermetically sealed from each other with a seal ring 15.

The stage 2 horizontally supports a semiconductor wafer (hereinafter, referred to as the "wafer W") as an example of a substrate, inside the processing container 1. The stage 2 is formed in a disk shape having a size corresponding to that of the wafer W, and is supported by a support member 23. The stage 2 is formed of a ceramic material such as aluminum nitride (AlN), or a metal material such as aluminum or a nickel-based alloy. A heater 21 is embedded in the stage 2 so as to heat the wafer W. The heater 21 generates heat based on power provided from a heater power supply (not illustrated). The wafer W is controlled to be heated at a predetermined temperature by controlling the output of the heater 21 based on a temperature signal provided from a thermocouple (not illustrated) provided in the vicinity of a wafer placement surface on an upper surface of the stage 2.

The stage 2 is provided with a cover member 22 made of ceramic such as alumina so as to cover an outer peripheral area of the wafer placement surface and a side surface of the stage 2.

The support member 23 extends downward of the processing container 1 through a hole formed in a bottom wall of the processing container 1 from the center of a bottom surface of the stage 2. A lower end of the support member 123 is connected to a lifting mechanism 24. The stage 2 is raised or lowered by the lifting mechanism 24 via the support member 23 between a processing position illustrated in FIG. 1 and a transfer position (indicated by a dashed double-dotted line below the processing position) at which the wafer W is capable of being transferred. Below the processing container 1, a flange 25 is provided in the support member 23. A bellows 26, which isolates an internal atmosphere of the processing container 1 from ambient air, is provided between the bottom surface of the processing container 1 and the flange 25 to extend and contract with the upward-downward movement of the stage 2.

Three wafer support pins 27 (only two illustrated in FIG. 1) are provided in the vicinity of the bottom surface of the processing container 1 to protrude upwards from a lifting plate 27a. The wafer support pins 27 are configured to be raised or lowered via the lifting plate 27a by a lifting mechanism 28 provided below the processing container 1. The wafer support pins 27 are inserted into through holes 2a formed in the stage 2 when the stage 2 is located at the transfer position so that they can be moved upward and downward on the upper surface of the stage 2. By moving upward and downward the wafer support pins 27 in this manner, the wafer W is delivered between a wafer transfer mechanism (not illustrated) and the stage 2.

The shower head 3 supplies a processing gas into the processing container 1 in the form of a shower. The shower head 3 is formed of metal, and is provided to face the stage 2. The shower head 3 has a diameter that is substantially the same as that of the stage 2. The shower head 3 includes a main body 31 fixed to the ceiling wall 14 of the processing container 1 and a shower plate 32 connected to a lower surface of the main body 31. A gas diffusion space 33 is defined between the main body 31 and the shower plate 32. A gas introduction hole 36 is formed to penetrate through the centers of the main body 31 and the ceiling wall 14 of the processing container 1, and is connected to the gas diffusion space 33. An annular protruded portion 34 is formed on the peripheral edge of the shower plate 32 to protrude downward. Gas ejection holes 35 are formed in a flat surface inward of the annular protruded portion 34 in the shower plate 32.

When the stage 2 is located at the processing position, a processing space 37 is formed between the stage 2 and the shower plate 32. An upper surface of the cover member 22 and the annular protruded portion 34 of the stage 2 are close to each other so as to form an annular gap 38 therebetween.

The exhaust part 4 exhausts the interior of the processing container 1. The exhaust part 4 includes an exhaust pipe 41 connected to the exhaust port 13b of the exhaust duct 13, and an exhaust mechanism 42 connected to the exhaust pipe 41. The exhaust mechanism 42 includes a vacuum pump, a pressure control valve, and the like. During processing, the gas in the processing container 1 reaches the exhaust duct 13 through the slit 13a, and is exhausted from the exhaust duct 13 through the exhaust pipe 41 by the exhaust mechanism 42 of the exhaust part 4.

The processing gas supply mechanism 5 supplies the processing gas into the shower head 3. The processing gas supply mechanism 5 includes a $WCl_6$ gas supply mechanism G1, an H2 gas source G2, a first $N_2$ gas source G3, and a second $N_2$ gas source G4.

The $WCl_6$ gas supply mechanism G1 supplies a tungsten hexachloride ($WCl_6$) gas, which is an example of a tungsten chloride gas, into the processing container 1 through a $WCl_6$ gas supply line L1. The $WCl_6$ gas supply line L1 is a line extending from the $WCl_6$ gas supply mechanism G1.

An opening/closing valve 96a, an opening/closing valve 96b, a mass flow meter (MFM) 97, a buffer tank T1, and an opening/closing valve V1 are provided in the $WCl_6$ gas supply line L1 in the named order from the upstream side. The opening/closing valves 96a and 96b are provided near a film-forming-material tank 91 in the $WCl_6$ gas supply line L1. The mass flow meter 97 detects a flow rate of the $WCl_6$ gas flowing through the $WCl_6$ gas supply line L1. The buffer tank T1 temporarily stores the $WCl_6$ gas, and supplies necessary $WCl_6$ gas in a short period of time. The opening/closing valve V1 is a valve for switching the supply and cutoff of the gas during ALD, and may be an ALD-based valve that is openable/closable at high speed. In some embodiments, the ALD-based valve may be opened/closed at a time interval of not more than 0.5 seconds, specifically at a time interval of not more than 0.01 seconds.

The $WCl_6$ gas supply mechanism G1 includes the film-forming-material tank 91 as a raw material container that accommodates $WCl_6$ as a solid raw material, which stays in a solid state at normal temperature. A heater 91a is provided around the film-forming-material tank 91. The heater 91a heats the film forming material inside the film-forming-material tank 91 to an appropriate temperature for sublimation of $WCl_6$. The $WCl_6$ gas supply line L1 is inserted into the film-forming-material tank 91 from above.

In the $WCl_6$ gas supply mechanism G1, one end of a carrier gas pipe 92 is inserted into the film-forming-material tank 91 from above. The other end of the carrier gas pipe 92 is connected to a carrier $N_2$ gas source 93. The carrier $N_2$ gas source 93 supplies an $N_2$ gas, which is an example of a carrier gas, into the carrier gas pipe 92.

A mass flow controller (MFC) 94, an opening/closing valve 95a, and an opening/closing valve 95b are provided in the carrier gas pipe 92 in the named order from the upstream side. The mass flow controller 94 controls a flow rate of the carrier $N_2$ gas flowing through the carrier gas pipe 92.

A bypass pipe 98 is provided so as to connect a position between the opening/closing valve 95a and the opening/closing valve 95b in the carrier gas pipe 92 and a position between the opening/closing valve 96a and the opening/closing valve 96b in the $WCl_6$ gas supply line L1. The bypass pipe 98 is a pipe for supplying the carrier $N_2$ gas, which is supplied from the carrier $N_2$ gas source 93 to the carrier gas pipe 92, to the $WCl_6$ gas supply line L1 without passing through the film-forming-material tank 91. An opening/closing valve 99 is provided in the bypass pipe 98. By closing the opening/closing valves 95b and 96a and opening the opening/closing valves 95a, 99, and 96b, the carrier $N_2$ gas supplied from the carrier $N_2$ gas source 93 is supplied to the $WCl_6$ gas supply line L1 via the carrier gas pipe 92 and the bypass pipe 98. Thus, it is possible to purge the $WCl_6$ gas supply line L1.

The upstream side of the mass flow meter 97 in the $WCl_6$ gas supply line L1 is joined with the downstream end of a diluent $N_2$ gas supply line 100 through which an $N_2$ gas as a diluent gas is supplied. A diluent $N_2$ gas source 101 for supplying the $N_2$ gas is provided in the upstream end of the diluent $N_2$ gas supply line 100. A mass flow controller 102 and an opening/closing valve 103 are provided in the diluent $N_2$ gas supply line 100 in the named order from the upstream side.

One end of an Evac line 104 is connected between the buffer tank T1 and the opening/closing valve V1 in the $WCl_6$ gas supply line L1. The Evac line 104 is a pipe that bypasses the processing container 1 and connects the $WCl_6$ gas supply line L1 to the exhaust pipe 41. The other end of the Evac line 104 is connected to the exhaust pipe 41. As a result, the interior of the buffer tank T1 is capable of being exhausted by the exhaust mechanism 42 through the Evac line 104.

An opening/closing valve 105, an orifice 107, and an opening/closing valve 106 are provided in the Evac line 104 in the named order from the upstream side.

The opening/closing valve 105 is an ALD-based valve that can be opened/closed at high speed. In some embodiments, the ALD-based valve may be opened/closed at a time interval of not more than 0.5 seconds, specifically at a time interval of not more than 0.01 seconds. By opening/closing the opening/closing valve 105, the $WCl_6$ gas supplied from the film-forming-material tank 91 can be intermittently supplied into the Evac line 104. The opening/closing valve 105 may be opened/closed at the same speed or substantially the same speed as the opening/closing valve V1. Thus, the $WCl_6$ gas can be supplied into the Evac line 104 and be exhausted from the Evac line 104 in the same frequency as that of the supply of the $WCl_6$ gas from the film-forming-material tank 91 into the processing space 37 through the opening/closing valve V1.

The orifice 107 is provided between the opening/closing valve 105 and the opening/closing valve 106. The orifice 107 is provided to bring am internal pressure of the Evac line 104 closer to an internal pressure of the processing container 1 during the processing.

The opening/closing valve 106 is provided at the downstream side of the orifice 107. By opening the opening/closing valve 106, the interior of the Evac line 104 is exhausted by the exhaust mechanism 42.

The downstream end of the pressure adjustment gas supply line 110 through which a pressure adjustment gas to the Evac line 104 is supplied is joined with the downstream side of the opening/closing valve 105 and the upstream side of the orifice 107 in the Evac line 104. A pressure adjustment gas source 111, which is a source of the pressure adjustment gas, is provided in the upstream end of the pressure adjustment gas supply line 110. A mass flow controller 112 and an opening/closing valve 113 are provided in the pressure adjustment gas supply line 110 in the named order from the upstream side. The pressure adjustment gas, supplied from the pressure adjustment gas source 111 and having a flow rate adjusted by the mass flow controller 112, is supplied to the Evac line 104 via the pressure adjustment gas supply line 110. The pressure adjustment gas may be an $N_2$ gas.

The $H_2$ gas source $G_2$ supplies an $H_2$ gas, which is an example of a reducing gas, into the processing container 1 via an $H_2$ gas supply line L2. The $H_2$ gas supply line L2 is a line extending from the $H_2$ gas source G2. The $WCl_6$ gas supply line L1 and the $H_2$ gas supply line L2 are joined with a joint pipe L0. The joint pipe L0 is connected to the gas introduction hole 36 described above. A mass flow controller M2, a buffer tank T2, and an opening/closing valve V2 are provided in the $H_2$ gas supply line L2 in the named order from the upstream side. The mass flow controller M2 controls a flow rate of the $H_2$ gas flowing through the $H_2$ gas supply line L2. The buffer tank T2 temporarily stores the $H_2$ gas, and supplies the $H_2$ gas in a short period of time, if necessary. The opening/closing valve V2 is a valve for switching the supply and cutoff of the gas during ALD, and may be an ALD-based valve that can be opened/closed at high speed. The ALD-based valve can be opened/closed at a time interval of 0.01 to 1.0 seconds.

The first $N_2$ gas source G3 supplies an $N_2$ gas, which is an example of a purge gas, into the processing container 1 via a first $N_2$ gas supply line L3. The first $N_2$ gas supply line L3 is a line that extends from the first $N_2$ gas source G3 and supplies the $N_2$ gas to the $WCl_6$ gas supply line L1. The first $N_2$ gas supply line L3 is branched into a first continuous $N_2$ gas supply line L31, which continuously supplies the $N_2$ gas during film formation through an ALD method, and a first flash purge line L32, which supplies the $N_2$ gas only in a purge step. The first continuous $N_2$ gas supply line L31 and the first flash purge line L32 are connected to a first connection line L33. The first connection line L33 is connected to the $WCl_6$ gas supply line L1. A mass flow controller M31 and an opening/closing valve V31 are provided in the first continuous $N_2$ gas supply line L31 in the named order from the upstream side. A mass flow controller M32 and an opening/closing valve V32 are provided in the first flash purge line L32 in the named order from the upstream side. The mass flow controllers M31 and M32 control a flow rate of the $N_2$ gas flowing through the first continuous $N_2$ gas supply line L31 and a flow rate of the $N_2$ gas flowing through the first flash purge line L32, respectively. The opening/closing valve V31 and the opening/closing valve V32 are valves for switching the supply and cutoff of gas during ALD, and may be ALD-based valves that can be opened/closed at high speed. The ALD-based valves can be opened/closed at a time interval of 0.01 to 1.0 seconds.

The second $N_2$ gas source G4 supplies an $N_2$ gas, which is an example of a purge gas, into the processing container 1 via a second first $N_2$ gas supply line L4. The second $N_2$ gas supply line L4 is a line, which extends from the second $N_2$ gas source G4 and supplies the $N_2$ gas to the $H_2$ gas supply line L2. The second $N_2$ gas supply line L4 is branched into a second continuous $N_2$ gas supply line L41, which continuously supplies the $N_2$ gas during film formation through an ALD method, and a second flash purge line L42, which supplies the $N_2$ gas only in the purge step. The second continuous $N_2$ gas supply line L41 and the second flash purge line L42 are connected to a second connection line L43. The second connection line L43 is connected to the $H_2$ gas supply line L2. A mass flow controller M41 and an opening/closing valve V41 are provided in the second continuous $N_2$ gas supply line L41 in the named order from the upstream side. A mass flow controller M42 and an opening/closing valve V42 are provided in the second flash purge line L42 in the named order from the upstream side. The mass flow controllers M41 and M42 control a flow rate of the $N_2$ gas flowing through the second continuous $N_2$ gas supply line L41 and a flow rate of the $N_2$ gas flowing through the second flash purge line L42, respectively. The opening/closing valve V41 and the opening/closing valve V42 are valves for switching the supply and cutoff of the gas during ALD, and may be ALD-based valves that can be opened/closed at high speed. The ALD-based valves can be opened/closed at a time interval of 0.01 to 1.0 seconds.

The controller 6 controls the operation of each part of the film forming apparatus. The controller 6 may be a computer. A computer program for controlling the operation of each part of the film forming apparatus is stored in a storage medium. The storage medium may be a flexible disk, a compact disk, a hard disk, a flash memory, a DVD or the like.

(Film Forming Method)

A film forming method according to an embodiment will be described by taking the case in which a tungsten film is formed using the film forming apparatus of FIG. 1 as an example. The film forming method according to an embodiment is implemented by controlling the operation of each part of the film forming apparatus by the controller 6. FIG. 2 is a flowchart illustrating an example of the film forming method.

As illustrated in FIG. 2, the film forming method according to an embodiment is a method of forming a tungsten film on a base film formed on a front surface of a substrate by performing an initial flow rate stabilization step S1, an etching step S2, and a film forming step S3 in the named order. However, the initial flow rate stabilization step S1 may be omitted.

Figure 4A:
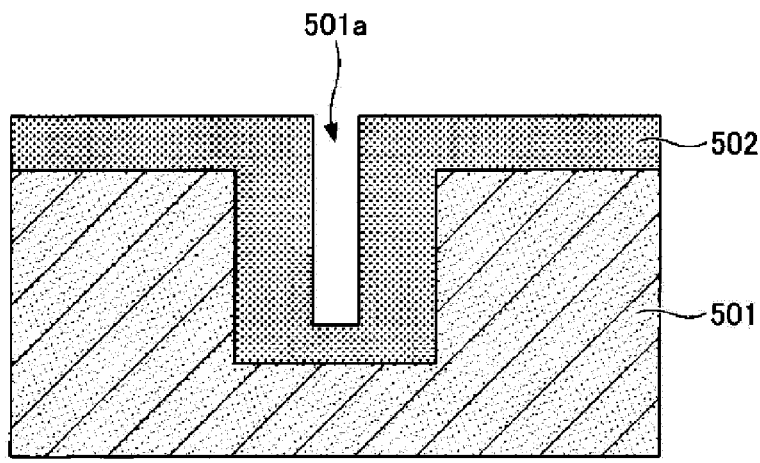
FIGS. 4A to 4C are cross-sectional process views illustrating the example of the film forming method.
Figure 4B:
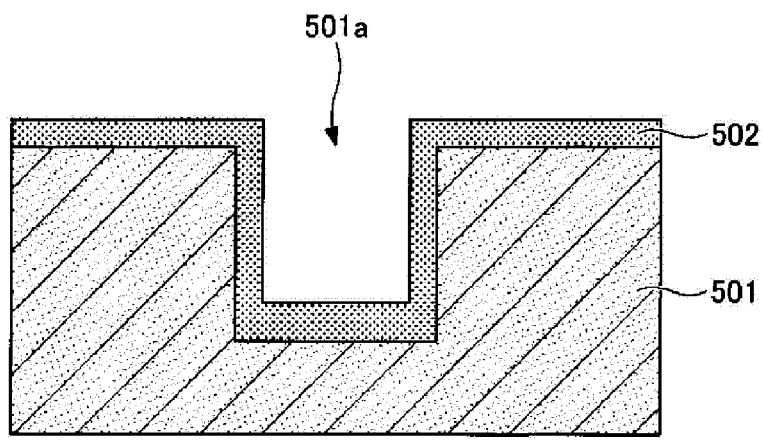
Figure 4C:
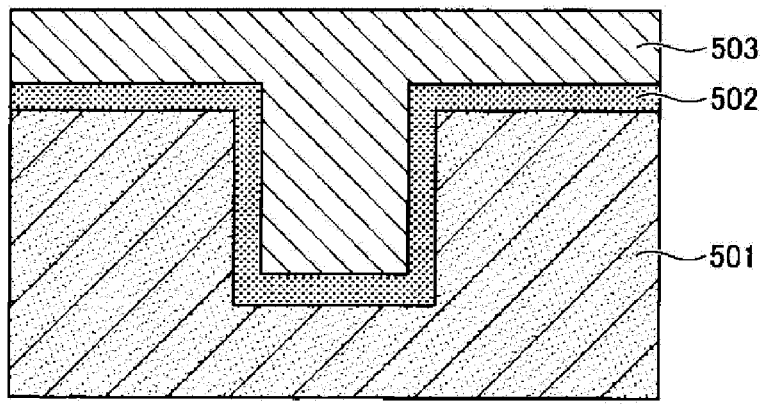

Each step will be described below. FIG. 3 is a view illustrating an example of a gas supply sequence in each of the etching step S2 and the film forming step S3. FIGS. 4A to 4C are cross-sectional process views illustrating an example of the film forming method. FIG. 4A illustrates a cross section of the substrate before the etching step S2, FIG. 4B illustrates a cross section of the substrate after the etching step S2, and FIG. 4C illustrates a cross section of the substrate after the film forming step S3. Below, the case in which the film forming method according to the embodiment is implemented from the state in which the opening/closing valves V1, V2, V31, V32, V41, and V42 remain in a closed state will be described as an example.

First, in the state in which the stage 2 is lowered to the transfer position, the gate valve 12 is opened, and the wafer W is loaded into the processing container 1 through the loading/unloading port 11 by a transfer apparatus (not illustrated), and is placed on the stage 2 heated to a predetermined temperature (for example, 350 degrees C. to 550 degrees C.) by the heater 21. Subsequently, the stage 2 is raised to the processing position, and the interior of the processing container 1 is depressurized to a predetermined pressure. Thereafter, the opening/closing valves V31 and V41 are opened. As a result, the $N_2$ gas is supplied into the processing container 1 from the first $N_2$ gas source G 3 and the second $N_2$ gas source G4 through the first continuous $N_2$ gas supply line L31 and the second continuous $N_2$ gas supply line L41 so that the internal pressure of the processing container 1 is increased. Thus, the temperature of the wafer W on the stage 2 is stabilized. For example, as illustrated in FIG. 4A, a wafer in which a base film 502 is formed on a front surface of a silicon film 501 having a recess 501a formed therein may be used as the wafer W. However, instead of the silicon film 501, a silicon oxide film may be formed. Example of the base film 502 may include a titanium-based material film such as a TiN film, a TiSiN film, a Ti silicide film, a Ti film, a $TiO_2$ film, a TiAlN film or the like, a tantalum-based material film such as a TaN film, a TaSiN film or the like, a tungsten-based compound film such as a WN film, a $WSi_x$ film, a WSiN film or the like. The base film 502 may be formed using another apparatus via the same vacuum transfer system. In addition, the base film 502 may be formed prior to the etching step S2 inside the same processing container 1 as that used in the etching step S2. After the base film 502 is formed in this way, the etching step S2 is performed without exposing the base film 502 to an atmosphere. This prevents the front surface of the base film 502 from being oxidized, and to suppress the occurrence of variation in the etching rate of the base film 502 in the etching step S2. A film thickness of the base film 502 is about 1 to 50 Å.

Subsequently, the initial flow rate stabilization step S1 is carried out. The initial flow rate stabilization step S1 is a step of intermittently supplying the $WCl_6$ gas to the Evac line 104. The initial flow rate stabilization step S1 is executed after the wafer W is loaded into the processing container 1.

In the initial flow rate stabilization step S1, first, the $WCl_6$ gas is supplied to the $WCl_6$ gas supply line L1, and the buffer tank T1 is filled with the $WCl_6$ gas. Specifically, in the state in which the opening/closing valves V1 and 105 are closed, by opening the opening/closing valves 95a, 95b, 96a, and 96b, the $N_2$ gas and the $WCl_6$ gas are supplied to the $WCl_6$ gas supply line L1 from the carrier $N_2$ gas source 93 and the film-forming-material tank 91, respectively. Further, by opening the opening/closing valve 103, the $N_2$ gas is supplied from the diluent $N_2$ gas supply line 100 to the $WCl_6$ gas supply line L1. The buffer tank T1 is filled with the $WCl_6$ gas and the $N_2$ gas supplied to the $WCl_6$ gas supply line L1.

After the buffer tank T1 is filled with the $WCl_6$ gas and the $N_2$ gas, the $WCl_6$ gas and the $N_2$ gas are intermittently supplied to the Evac line 104. Specifically, the $WCl_6$ gas and the $N_2$ gas are intermittently supplied to the Evac line 104 by opening and closing the opening/closing valve 105 at high speed in the state in which the opening/closing valve V1 is closed. Further, the opening/closing valve 106 is opened, and the $WCl_6$ gas and the $N_2$ gas supplied to the Evac line 104 are exhausted by the exhaust mechanism 42 through the orifice 107. As a result, it is possible to establish a gas supply environment substantially equivalent to that in the etching step S2 without supplying the $WCl_6$ gas and the $N_2$ gas into the processing container 1 prior to the etching step S2. Thus, the flow rate of the $WCl_6$ gas at the start of the etching step S2 is stabilized in a short period of time. The opening/closing timing of the opening/closing valve 105 may be the same or substantially the same as the opening/closing timing of the opening/closing valve V1 in the etching step S2. Thereby, it is possible to establish the gas supply environment in the etching step S2 with high accuracy.

In the initial flow rate stabilization step S1, in order to bring the internal pressure of the Evac line 104 closer to the internal pressure of the processing space 37 during film formation, the pressure adjustment gas may be supplied to the Evac line 104 from the pressure adjustment gas source 111 by opening the opening/closing valve 113. At this time, the flow rate of the pressure adjustment gas supplied to the Evac line 104 may be adjusted by the mass flow controller 112 such that the internal pressure of the Evac line 104 becomes substantially the same as the internal pressure of the processing space 37 during film formation.

Figure 6:
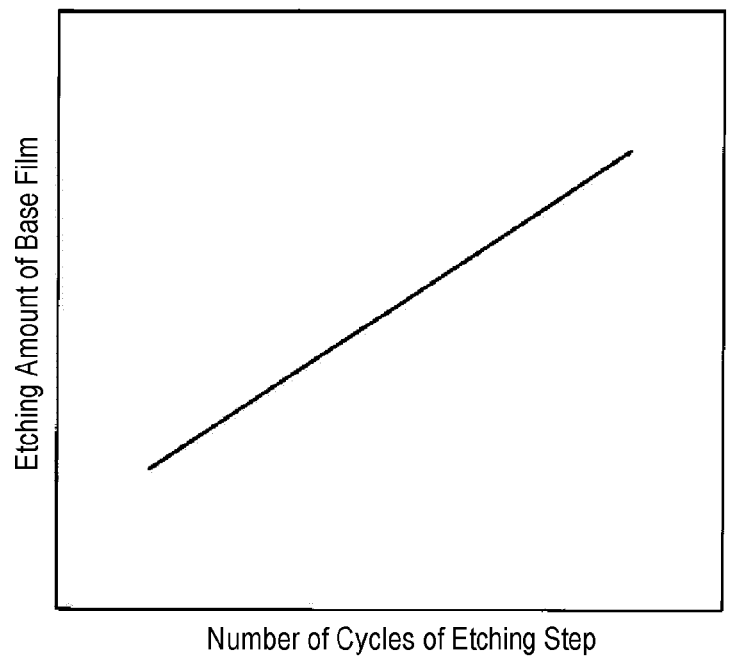
FIG. 6 is a graph representing an example of the relationship between the number of cycles of an etching step and an etched amount of a base film.

Subsequently, the etching step S2 is performed. The etching step S2 is a step of intermittently supplying the $WCl_6$ gas as an example of a tungsten chloride gas into the processing container 1 in which the wafer W is accommodated, while performing a purging step between the intermittent supply operations of the $WCl_6$ gas, and etching a portion of the base film to reduce a film thickness of the base film. In the etching step S2, as illustrated in FIG. 3, a series of operations of sequentially performing a first step S21 to a fourth step S24 is repeated a predetermined number of times. As a result, as illustrated in FIG. 4B, a portion of the base film 502 is etched, thus reducing the film thickness of the base film to a predetermined film thickness. The predetermined number of times may be determined based on relationship information representative of the relationship between the number of cycles of the etching step and the etched amount of the base film which are determined in advance. The relationship information may be a graph showing the relationship between the number of cycles of the etching step and the etched amount of the base film, as shown in FIG. 6. The relationship information may also be a table or a mathematical expression. The pieces of relation information may be prepared based on the results of preliminary tests. In an embodiment, the predetermined number of times may be 1 to 100 times, and the predetermined film thickness may be 1 Å to 40 Å. The first step S21 to the fourth step S24 of the etching step S2 may be the same as a first step S31 to a fourth step S34 of the film forming step S3 described later, except that no reducing gas is supplied.

The first step S21 is a step of supplying the $WCl_6$ gas, which is a raw material gas, into the processing space 37. In the first step S21, the $N_2$ gas (continuous purge $N_2$ gas) is supplied from the first $N_2$ gas source G3 and the second $N_2$ gas source G4 via the first continuous $N_2$ gas supply line L31 and the second continuous $N_2$ gas supply line L41 in the state in which the opening/closing valves V31 and V41 are opened. In an embodiment, the total flow rate of the continuous purge $N_2$ gas may be 200 sccm to 5,000 sccm. In addition, the $WCl_6$ gas is supplied into the processing space 37 from the $WCl_6$ gas supply mechanism G1 via the $WCl_6$ gas supply line L1 by opening the opening/closing V1. At this time, the $WCl_6$ gas, which is temporarily stored in the buffer tank T1 and has a flow rate stabilized in the initial flow rate stabilization step S1, is supplied. In an embodiment, the flow rate of the $WCl_6$ gas may be 10 mg/min to 200 mg/min.

The second step S22 is a step of purging excess $WCl_6$ gas or the like in the processing space 37. In the second step S22, in the state in which the supply of the $N_2$ gas through the first continuous $N_2$ gas supply line L31 and the second continuous $N_2$ gas supply line L41 is continuously performed, the opening/closing valve V1 is closed to stop the supply of the $WCl_6$ gas. In addition, by opening the opening/closing valves V32 and V42, the $N_2$ gas (flash purge $N_2$ gas) is also supplied from the first flash purge line L32 and the second flash purge line L42. As a result, the excess $WCl_6$ gas or the like in the processing space 37 is purged by the $N_2$ gas of a large flow rate.

The third step S23 is a step of supplying only the continuous purge $N_2$ gas into the processing space 37. In the third step S23, the opening/closing valves V32 and V42 are closed to stop the supply of the $N_2$ gas from the first flash purge line L32 and the second flash purge line L42. Meanwhile, the supply of the $N_2$ gas via the first continuous $N_2$ gas supply line L31 and the second continuous $N_2$ gas supply line L41 is continuously performed.

The fourth step S24 is a step of purging the processing space 37. In the fourth step S24, in the state in which the supply of the $N_2$ gas through the first continuous $N_2$ gas supply line L31 and the second continuous $N_2$ gas supply line L41 is continuously performed, the opening/closing valves V32 and V42 are opened. As a result, the $N_2$ gas (flash purge $N_2$ gas) is supplied from the first flash purge line L32 and the second flash purge line L42. Thus, the processing space 37 is purged with the $N_2$ gas of a large flow rate.

Subsequently, the film forming step S3 is performed. The film forming step S3 is a step of forming a tungsten film on the base film by alternately supplying the $WCl_6$ gas and the $H_2$ gas, which is an example of a reducing gas for reducing the $WCl_6$ gas, into the processing container 1, while performing a purging step between the alternate supply operations. In the film forming step S3, as illustrated in FIG. 3, a series of operations for sequentially performing the first step S31 to the fourth step S34 are repeated a predetermined number of times. Thereby, as illustrated in FIG. 4C, a tungsten film 503 having a desired film thickness is formed on the base film 502 having the thinned film thickness in the etching step S2. In an embodiment, the predetermined number of times may be 20 to 200 times.

The first step S31 is a step of supplying the $WCl_6$ gas, which is a raw material gas, into the processing space 37. In the first step S31, the $N_2$ gas (continuous purge $N_2$ gas) is supplied from the first $N_2$ gas source G3 and the second $N_2$ gas source G4 via the first continuous $N_2$ gas supply line L31 and the second continuous $N_2$ gas supply line L41 in the state in which the opening/closing valves V31 and V41 are opened. In an embodiment, the total flow rate of the continuous purge $N_2$ gas may be 200 sccm to 5,000 sccm. In addition, the $WCl_6$ gas is supplied into the processing space 37 from the $WCl_6$ gas supply mechanism G1 via the $WCl_6$ gas supply line L1 by opening the opening/closing V1. At this time, the $WCl_6$ gas, temporarily stored in the buffer tank T1, is supplied. In an embodiment, the flow rate of the $WCl_6$ gas may be 10 mg/min to 200 mg/min.

The second step S32 is a step of purging excess $WCl_6$ gas or the like in the processing space 37. In the second step S32, in the state in which the supply of the $N_2$ gas through the first continuous $N_2$ gas supply line L31 and the second continuous $N_2$ gas supply line L41 is continuously performed, the opening/closing valve V1 is closed to stop the supply of the $WCl_6$ gas. In addition, by opening the opening/closing valves V32 and V42, the $N_2$ gas (flash purge $N_2$ gas) is also supplied from the first flash purge line L32 and the second flash purge line L42. As a result, the excess $WCl_6$ gas or the like in the processing space 37 is purged with the $N_2$ gas of a large flow rate.

The third step S33 is a step of supplying the $H_2$ gas, which is a reducing gas, into the processing space 37. In the third step S33, the opening/closing valves V32 and V42 are closed to stop the supply of the $N_2$ gas from the first flash purge line L32 and the second flash purge line L42. In addition, in the state in which the supply of the $N_2$ gas through the first continuous $N_2$ gas supply line L31 and the second continuous $N_2$ gas supply line L41 is continuously performed, the opening/closing valve V2 is opened. Thus, the $H_2$ gas, which is an example of a reducing gas, is supplied into the processing space 37 from the $H_2$ gas source G2 via the $H_2$ gas supply line L2. At this time, the $H_2$ gas is temporarily stored in the buffer tank T1 and is then supplied into the processing container 1. In the third step S33, the $WCl_6$ gas adsorbed onto the wafer W is reduced. A flow rate of the $H_2$ gas at this time may be set to an amount sufficient for causing the reduction reaction.

The fourth step S34 is a step of purging excess $H_2$ gas in the processing space 37. In the fourth step S34, in the state in which the supply of the $N_2$ gas through the first continuous $N_2$ gas supply line L31 and the second continuous $N_2$ gas supply line L41 is continuously performed, the opening/closing valve V2 is closed to stop the supply of the $H_2$ gas from the $H_2$ gas supply line L2. In addition, the opening/closing valves V32 and 42 are opened to supply the $N_2$ gas (flash purge $N_2$ gas) from the first flash purge line L32 and the second flash purge line L42. Thus, the excess $H_2$ gas in the processing space 37 is purged with the $N_2$ gas of a large flow rate.

As described above, according to the film forming method of the embodiment, the etching step S2 and the film forming step S3 are performed in the named order on the wafer W in which the base film 502 is formed as a continuous film on the front surface of the silicon film 501 having the recess 501a formed therein. Thus, the state of the continuous film is maintained even if the film thickness of the base film 502 is reduced to a predetermined film thickness (for example, 1 Å to 40 Å) in the etching step S2. Therefore, it is possible to form the tungsten film 503 with good adhesion without damaging the silicon film 501 in the film forming step S3. Further, by reducing the film thickness of the base film 502 inside the recess 501a, it is possible to increase a ratio of the tungsten film 503 embedded in the recess 501a. This makes it possible to reduce a resistance of the tungsten film 503 embedded in the recess 501a.

Figure 5:
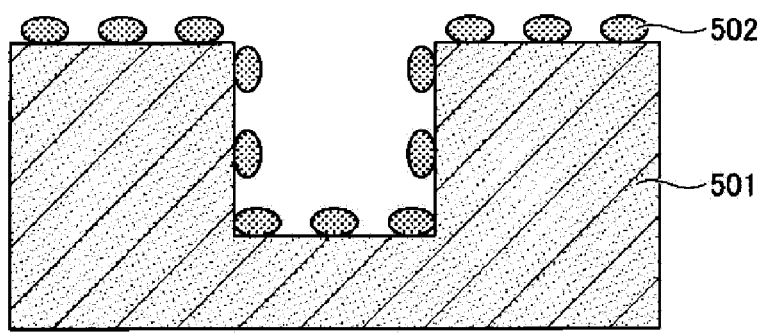
FIG. 5 is an explanatory view of a conventional film forming method.

It is also conceivable to initially form the base film 502 having a relatively small thickness on the front surface of the silicon film 501 having the recess 501a formed therein. However, in this case, as illustrated in FIG. 5, the base film 502 is formed in island shapes, thus becoming a discontinuous film. This makes it difficult to form the tungsten film 503 with good adhesion without damaging the silicon film 501 in the film forming step S3. FIG. 5 is an explanatory view of a conventional film forming method.

According to the film forming method according to an embodiment, the etching step S2 and the film forming step S3 are continuously performed in the same processing container. This makes it possible to prevent the front surface of the base film 502 from being oxidized, thus forming the tungsten film 503 with lower resistance containing no oxygen and with good adhesion in the film forming step S3.

In addition, according to the film forming method according to the embodiment, the first step S21 to the fourth step S24 of the etching step S2 may be the same as the first step S31 to the fourth step S34 of the film forming step S3 except that no reducing gas is supplied. As a result, the gas supply can be stably performed without causing destabilization of the solid raw material, which is involved by alternately performing the etching step S2 and the film forming step S3.

It should be noted that the embodiments disclosed herein are exemplary in all respects and are not restrictive. The above-described embodiments may be omitted, replaced or modified in various forms without departing from the scope and spirit of the appended claims.

In the above embodiment, the case of using the $WCl_6$ gas as a tungsten chloride gas has been described as an example, but the present disclosure is not limited thereto. For example, a tungsten pentachloride ($WCl_5$) gas may be used as the $WCl_6$ gas. Even in the case of using the $WCl_5$ gas, substantially the same behavior as the $WCl_6$ gas is shown. In the case of using the $WCl_5$ gas, $WCl_5$, which remains in a solid state at normal temperature, may be used as a film forming material.

In the embodiment described above, although the case of using the $H_2$ gas as a reducing gas has been described as an example, any reducing gas containing hydrogen may be used. In addition to the $H_2$ gas, the $SiH_4$ gas, the $B_2H_6$ gas, the $NH_3$ gas, or the like may also be used. Among the $H_2$ gas, the $SiH_4$ gas, the $B_2H_6$ gas, and the $NH_3$ gas, two or more gases may be supplied. Furthermore, as reducing gases other than these gases, for example, a $PH_3$ gas, an $SiH_2Cl_2$ gas and the like may be used. From the viewpoint of further reducing impurities in a film to obtain a low resistance value, the $H_2$ gas may be used. In addition, as the carrier gas and the purge gas, instead of the $N_2$ gas, other inert gases such as an Ar gas may be used.

In the embodiment described above, the semiconductor wafer has been described as an example of a substrate, but the semiconductor wafer may be a silicon wafer or a compound semiconductor wafer of GaAs, SiC, GaN, or the like. Furthermore, the substrate is not limited to the semiconductor wafer, and may be a glass substrate used for a flat panel display (FPD) such as a liquid crystal display device, a ceramic substrate, or the like.

According to the present disclosure, it is possible to increase an amount of a tungsten film embedded in a recess by reducing a base film in film thickness.

What is claimed is:

1. A film forming method comprising:
    an etching step of etching a portion of a base film to reduce a film thickness of the base film by intermittently supplying a tungsten chloride gas into a processing container while performing a purging step in the course of the intermittent supply of the tungsten chloride gas, wherein the processing container accommodates a substrate, and the base film is formed on a surface of the substrate; and
    a film forming step of forming a tungsten film on the base film by alternately supplying the tungsten chloride gas and a reducing gas for reducing the tungsten chloride gas into the processing container while performing the purging step in the course of the alternate supply of the tungsten chloride gas and the reducing gas, wherein the film forming step occurs after the etching step.

2. The film forming method of claim 1, wherein the etching step and the film forming step are performed in a same processing container in a continuous manner.

3. The film forming method of claim 1, wherein the film forming step comprises repeating a first cycle, the first cycle including a first step of supplying the tungsten chloride gas into the processing container, a second step of supplying a purge gas into the processing container, a third step of supplying the reducing gas into the processing container, and a fourth step of supplying the purge gas into the processing container, the first step, the second step, the third step and the fourth step being performed in a sequential manner in the first cycle, and
    the etching step comprises repeating a second cycle, the second cycle including the first step, the second step, the third step, and the fourth step, which are performed in a sequential manner, wherein in the third step of the etching step, the reducing gas is not supplied into the processing container.

4. The film forming method of claim 1, further comprising:
    an initial flow rate stabilization step of supplying the tungsten chloride gas to an Evac line connected to an exhaust pipe provided to bypass the processing container, and exhausting the tungsten chloride gas, wherein the initial flow rate stabilization step occurs before the etching step.

5. The film forming method of claim 4, wherein the initial flow rate stabilization step includes intermittently supplying the tungsten chloride gas in the same frequency or substantially the same frequency as that of the etching step.

6. The film forming method of claim 1, wherein a recess is formed in the surface of the substrate,
    the base film is formed at least in the recess, and
    the film forming step comprises forming the tungsten film in the recess to fill the recess.

7. The film forming method of claim 1, wherein the base film is a TiN film,
    the tungsten chloride gas is a gas generated by sublimating $WCl_6$, and
    the reducing gas is an $H_2$ gas.

8. A film forming apparatus comprising:
    a processing container in which a substrate having a base film formed thereon is accommodated;
    a processing gas supply mechanism configured to supply a tungsten chloride gas and a reducing gas for reducing the tungsten chloride gas into the processing container; and
    a controller,
    wherein the controller is configured to execute:
    an etching step of etching a portion of the base film to reduce a film thickness of the base film by intermittently supplying the tungsten chloride gas into the processing container while performing a purging step in the course of the intermittent supply of the tungsten chloride gas; and a film forming step of forming a tungsten film on the base film by alternately supplying the tungsten chloride gas and the reducing gas for reducing the tungsten chloride gas into the processing container while performing the purging step in the course of the alternate supply of the tungsten chloride gas and the reducing gas.

* * * * *